(12) United States Patent
Satoh

(10) Patent No.: US 9,627,515 B2
(45) Date of Patent: Apr. 18, 2017

(54) METHOD OF MANUFACTURING THIN-FILM TRANSISTOR SUBSTRATE

(71) Applicant: JOLED INC., Tokyo (JP)

(72) Inventor: Eiichi Satoh, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/025,389

(22) PCT Filed: Jul. 1, 2014

(86) PCT No.: PCT/JP2014/003508
§ 371 (c)(1),
(2) Date: Mar. 28, 2016

(87) PCT Pub. No.: WO2015/049818
PCT Pub. Date: Apr. 9, 2015

(65) Prior Publication Data
US 2016/0240632 A1 Aug. 18, 2016

(30) Foreign Application Priority Data

Oct. 3, 2013 (JP) ................................ 2013-208652

(51) Int. Cl.
*H01L 29/66* (2006.01)
*H01L 29/41* (2006.01)
(Continued)

(52) U.S. Cl.
CPC .. *H01L 29/66969* (2013.01); *H01L 21/02164* (2013.01); *H01L 21/02274* (2013.01);
(Continued)

(58) Field of Classification Search
CPC ......... H01L 29/66969; H01L 29/78606; H01L 29/7869; H01L 21/31116; H01L 21/02164; H01L 21/02178; H01L 21/02664
See application file for complete search history.

(56) References Cited

U.S. PATENT DOCUMENTS 7,994,039 B2  8/2011  Hirasawa et al.
8,247,811 B2  8/2012  Morosawa et al.
(Continued)

FOREIGN PATENT DOCUMENTS

JP  2008-282887  11/2008
JP  2009-302502  12/2009
(Continued)

OTHER PUBLICATIONS

International Search Report (ISR) from International Searching Authority (Japan Patent Office) in International Pat. Appl. No. PCT/JP2014/003508, dated Sep. 22, 2014.

*Primary Examiner* — Jaehwan Oh
(74) *Attorney, Agent, or Firm* — Greenblum & Bernstein, P.L.C.

(57) ABSTRACT

A method of manufacturing a thin-film transistor substrate that includes a thin-film transistor having a semiconductor layer, includes: forming a CuMn alloy film (third conductive film) above a substrate; forming a first silicon oxide film (first insulation film) on the CuMn alloy film at a first temperature; forming an aluminum oxide film (second insulation film) on the first silicon oxide film; and forming a second silicon oxide film (third insulation film) on the aluminum oxide film at a second temperature higher than the first temperature.

12 Claims, 10 Drawing Sheets

(51) Int. Cl.
  *H01L 29/49*      (2006.01)
  *H01L 29/786*     (2006.01)
  *H01L 21/02*      (2006.01)
  *H01L 21/465*     (2006.01)
  *H01L 23/532*     (2006.01)
  *H01L 21/768*     (2006.01)

(52) U.S. Cl.
  CPC ...... *H01L 21/02592* (2013.01); *H01L 21/465* (2013.01); *H01L 29/41* (2013.01); *H01L 29/4908* (2013.01); *H01L 29/78693* (2013.01); *H01L 21/76801* (2013.01); *H01L 21/76804* (2013.01); *H01L 23/53233* (2013.01); *H01L 2924/0002* (2013.01)

(56) References Cited

U.S. PATENT DOCUMENTS

| | | | |
|---|---|---|---|
| 8,377,723 B2 | 2/2013 | Nagai et al. | |
| 8,395,316 B2 | 3/2013 | Nagayama et al. | |
| 8,541,781 B2* | 9/2013 | Noda | H01L 27/1156 257/43 |
| 8,785,923 B2* | 7/2014 | Noda | H01L 21/82380 257/330 |
| 8,792,260 B2* | 7/2014 | Fujita | H02M 7/217 363/127 |
| 8,866,140 B2 | 10/2014 | Koike et al. | |
| 8,927,329 B2* | 1/2015 | Imoto | H01L 21/0242 257/42 |
| 8,927,990 B2* | 1/2015 | Sasaki | H01L 29/7869 257/57 |
| 9,184,090 B2 | 11/2015 | Choi et al. | |
| 2008/0217648 A1* | 9/2008 | Ohara | H05B 33/14 257/103 |
| 2009/0280583 A1 | 11/2009 | Hirasawa et al. | |
| 2010/0155951 A1* | 6/2010 | Koike | H01L 21/2855 257/751 |
| 2010/0193784 A1 | 8/2010 | Morosawa et al. | |
| 2011/0121753 A1 | 5/2011 | Nagayama et al. | |
| 2011/0263124 A1 | 10/2011 | Hirasawa et al. | |
| 2011/0297930 A1 | 12/2011 | Choi et al. | |
| 2012/0052602 A1* | 3/2012 | Hatano | H01L 27/1225 438/14 |
| 2012/0231581 A1* | 9/2012 | Yamazaki | H01L 29/78693 438/104 |
| 2012/0241811 A1* | 9/2012 | Kim | H01L 51/5253 257/100 |
| 2012/0261664 A1* | 10/2012 | Saito | H01L 21/84 257/57 |
| 2012/0313152 A1* | 12/2012 | Yokoi | H01L 21/02554 257/288 |
| 2013/0112972 A1 | 5/2013 | Koike et al. | |
| 2013/0181212 A1* | 7/2013 | Kim | H01L 21/02554 257/43 |
| 2014/0273341 A1* | 9/2014 | Van Duren | H01L 21/30604 438/104 |
| 2014/0339546 A1* | 11/2014 | Yamazaki | H01L 29/78603 257/43 |
| 2015/0076467 A1* | 3/2015 | Sasaki | H01L 21/31111 257/40 |
| 2015/0091002 A1* | 4/2015 | Hayashi | H01L 21/02554 257/43 |
| 2015/0099327 A1* | 4/2015 | Higashi | C09K 13/06 438/104 |
| 2015/0179809 A1* | 6/2015 | Liu | H01L 29/78606 257/72 |
| 2015/0194475 A1* | 7/2015 | Kawashima | H01L 29/7869 257/40 |
| 2015/0200208 A1* | 7/2015 | Lee | H01L 27/1225 257/43 |
| 2015/0236167 A1* | 8/2015 | Yamazaki | H01L 29/7869 257/43 |

FOREIGN PATENT DOCUMENTS

| | | |
|---|---|---|
| JP | 2010-027584 | 2/2010 |
| JP | 2010-182818 | 8/2010 |
| JP | 2011-258949 | 12/2011 |
| JP | 2013-067857 | 4/2013 |
| WO | 2012/002574 | 1/2012 |
| WO | 2013/190838 | 12/2013 |

* cited by examiner

| Deposition temperature [°C] | | Number of film floating defects |
|---|---|---|
| First insulation film (lower-layer SiO) | Third insulation film (upper-layer SiO) | |
| 215 °C | 290 °C | < 10 |
| 230 °C | 230 °C | > 2000 |
| | 260 °C | approx. 200 |
| | 290 °C | < 10 |
| | 360 °C | < 10 |
| 245 °C | 230 °C | > 2000 |
| | 290 °C | approx. 400 |

METHOD OF MANUFACTURING THIN-FILM TRANSISTOR SUBSTRATE

TECHNICAL FIELD

The technology disclosed herein relates to a method of manufacturing a thin-film transistor substrate.

BACKGROUND ART

Active matrix display devices, such as liquid crystal display devices and organic electroluminescence (EL) display devices, include a thin-film transistor (TFT) substrate in which TFTs are formed as switching elements or drive elements.

For example, Patent Literature (PTL) 1 describes an active matrix organic EL display device including a TFT substrate.

A plurality of conductive layers including TFT electrodes, lines, etc. are formed in the TFT substrate. An insulation layer composed of a silicon oxide film, a silicon nitride film, or the like is formed between the conductive layers, as an interlayer insulation film.

CITATION LIST

Patent Literature

[PTL 1]
Japanese Unexamined Patent Application Publication No. 2010-027584

SUMMARY OF INVENTION

Technical Problem

Openings (contact holes) are formed through the insulation layer in order to connect electrodes, lines, etc. in the upper and lower conductive layers. The formation of an opening through the insulation layer, however, may cause film floating of the insulation layer. This leads to a problem of failing to obtain a TFT substrate with desired performance.

The technology disclosed herein has an object of providing a TFT substrate with desired performance.

Solution to Problem

To achieve the stated object, one aspect of a method of manufacturing a thin-film transistor substrate according to the present disclosure is a method of manufacturing a thin-film transistor substrate that includes a thin-film transistor having a semiconductor layer, the method of manufacturing the thin-film transistor substrate including: forming a CuMn alloy film above a substrate; forming a first silicon oxide film on the CuMn alloy film at a first temperature; forming an aluminum oxide film on the first silicon oxide film; and forming a second silicon oxide film on the aluminum oxide film at a second temperature higher than the first temperature.

Advantageous Effects of Invention

A TFT substrate with desired performance can be realized.

DESCRIPTION OF EMBODIMENTS

Embodiment

The following describes an embodiment of the present disclosure with reference to drawings. Each of the embodiments described below shows a general or specific example. The numerical values, shapes, materials, structural elements, the arrangement and connection of the structural elements, steps, the processing order of the steps etc. illustrated in the following embodiments are mere examples, and do not limit the scope of the present disclosure. Of the structural elements in the embodiments described below, the structural elements not recited in any one of the independent claims representing the broadest concepts are described as optional structural elements.

Note that each drawing is a schematic and does not necessarily provide precise depiction. The substantially same structural elements are given the same reference signs throughout the drawings, and their detailed description is omitted or simplified.

[Organic EL Display Device]

Figure 1:
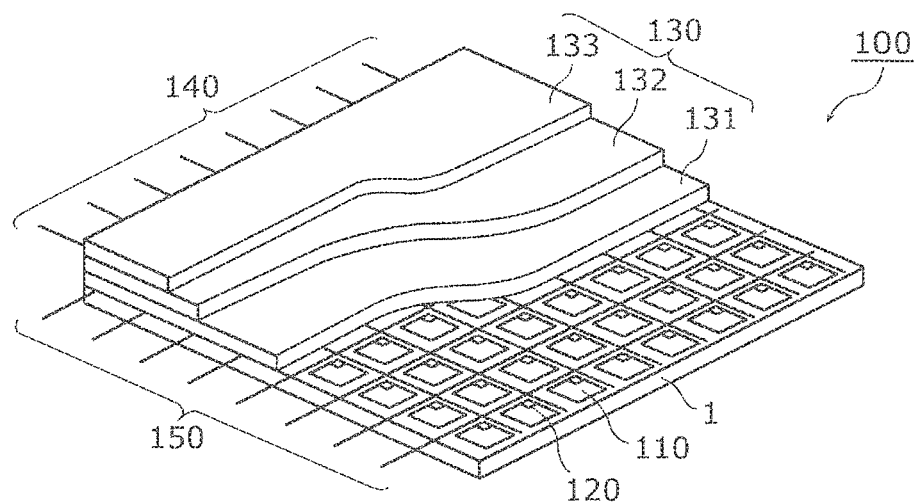
FIG. 1 is a partially cutaway perspective view of an organic EL display device according to an embodiment.
Figure 2:
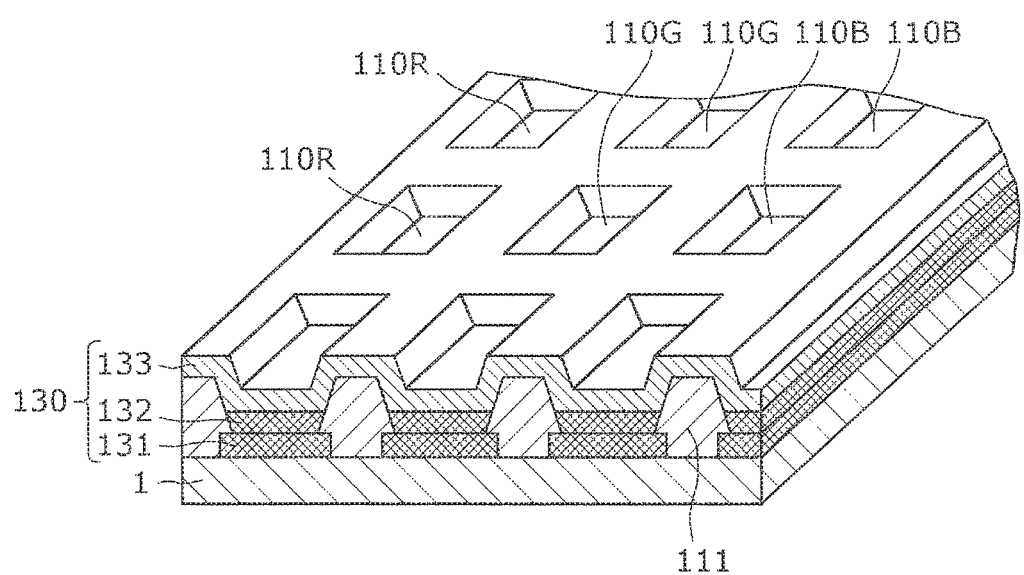
FIG. 2 is a perspective view illustrating an example of the pixel banks of the organic EL display device according to the embodiment.

An example of the structure of an organic EL display device 100 including a TFT substrate is described first, with reference to FIGS. 1 and 2. FIG. 1 is a partially cutaway perspective view of the organic EL display device according to the embodiment. FIG. 2 is a perspective view illustrating an example of the pixel banks of the organic EL display device according to the embodiment.

As illustrated in FIG. 1, the organic EL display device 100 has a stack structure of a TFT substrate (TFT array substrate) 1 and an organic EL element (light emitting part) 130. The TFT substrate 1 has a plurality of thin-film transistors arranged therein. The organic EL element 130 includes an anode 131 which is a lower electrode (reflection electrode), an EL layer (light emitting layer) 132, and a cathode 133 which is an upper electrode (transparent electrode).

A plurality of pixels 110 are arranged in the TFT substrate 1 in a matrix. Each pixel 110 is provided with a pixel circuit 120.

The organic EL element 130 is formed in association with each of the plurality of pixels 110. The pixel circuit 120 in each pixel 110 controls the light emission of the corresponding organic EL element 130. The organic EL elements 130 are formed on an interlayer insulation film (planarizing film) that is formed to cover the plurality of thin-film transistors.

Each organic EL element 130 has the EL layer 132 between the anode 131 and the cathode 133. In addition, a hole transport layer is formed between the anode 131 and the EL layer 132, and an electron transport layer is formed between the EL layer 132 and the cathode 133. Any other functional layer(s) may be disposed between the anode 131 and the cathode 133. Each functional layer formed between the anode 131 and the cathode 133, including the EL layer 132, is an organic layer made of an organic material.

Each pixel 110 is driven by the corresponding pixel circuit 120. In the TFT substrate 1, a plurality of gate lines (scan lines) 140 are arranged along the row direction of the pixels 110, a plurality of source lines (signal lines) 150 are arranged along the column direction of the pixels 110 so as to intersect with the gate lines 140, and a plurality of power lines (not illustrated in FIG. 1) are arranged in parallel with the source lines 150. The pixels 110 are defined by, for example, the gate lines 140 and source lines 150 orthogonal to each other.

The gate lines 140 are each connected to the gate electrode of a first thin-film transistor included in each pixel circuit 120 and operating as a switching element, on a row-by-row basis. The source lines 150 are each connected to the source electrode of the first thin-film transistor, on a column-by-column basis. The power lines are each connected to the drain electrode of a second thin-film transistor included in each pixel circuit 120 and operating as a drive element, on a column-by-column basis.

As illustrated in FIG. 2, each pixel 110 in the organic EL display device 100 is composed of subpixels 110R, 110G, and 110B of three colors (red, green, blue). The plurality of subpixels 110R, 110G, and 110B are arranged on a display surface in the form of a matrix. The subpixels 110R, 110G, and 110B are separated from each other by banks 111. The banks 111 are formed in a grid so that projections lying in parallel with the gate lines 140 and projections lying in parallel with the source lines 150 intersect with each other. The portions enclosed by the projections (i.e. the openings of the banks 111) and the subpixels 110R, 110G, and 110B are in a one-to-one correspondence with each other. Although the banks 111 are pixel banks in this embodiment, the banks 111 may be line banks.

The anode 131 is formed on the interlayer insulation film (planarizing film) on the TFT substrate 1 and in the opening of the bank 111, for each of the subpixels 110R, 110G, and 110B. Likewise, the EL layer 132 is formed on the anode 131 and in the opening of the bank 111, for each of the subpixels 110R, 110G, and 110B. The transparent cathode 133 is formed continuously on the plurality of banks 111 so as to cover all EL layers 132 (all subpixels 110R, 110G, and 110B).

The pixel circuit 120 is provided for each of the subpixels 110R, 110G, and 110B. Each of the subpixels 110R, 110G, and 110B and its corresponding pixel circuit 120 are electrically connected to each other by a contact hole and a relay electrode. The subpixels 110R, 110G, and 110B have the same structure except that the respective EL layers 132 emit different colors of light.

Figure 3:
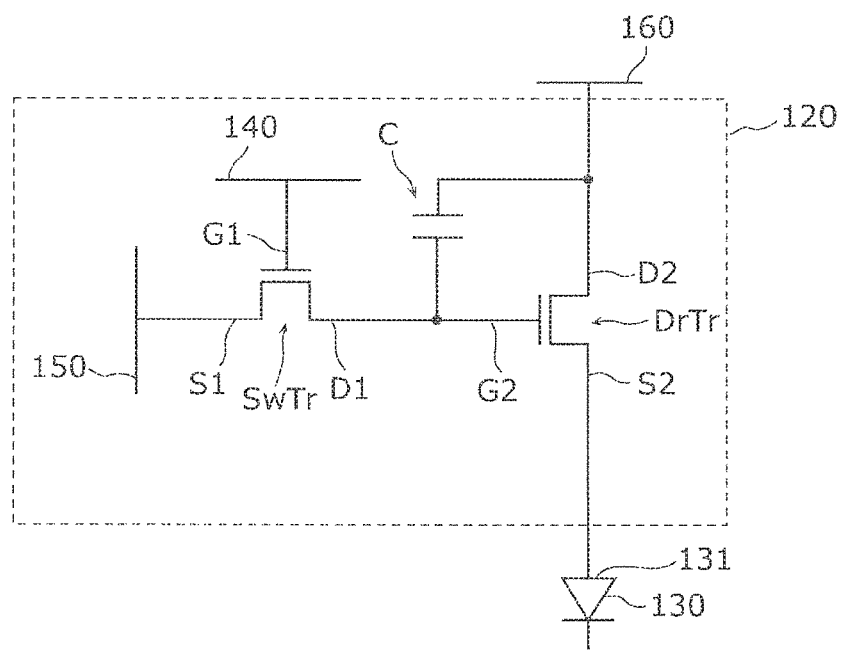
FIG. 3 is an electrical circuit diagram illustrating the structure of a pixel circuit in the organic EL display device according to the embodiment.

The circuit structure of the pixel circuit 120 in each pixel 110 is described below, with reference to FIG. 3. FIG. 3 is an electrical circuit diagram illustrating the structure of a pixel circuit in the organic EL display device according to the embodiment.

As illustrated in FIG. 3, the pixel circuit 120 includes a first thin-film transistor SwTr that operates as a switching element, a second thin-film transistor DrTr that operates as a drive element, and a capacitor C that stores data to be displayed at the corresponding pixel 110. In this embodiment, the first thin-film transistor SwTr is a switching transistor for selecting the pixel 110, and the second thin-film transistor DrTr is a drive transistor for driving the organic EL element 130.

The first thin-film transistor SwTr has a gate electrode G1 connected to the gate line 140, a source electrode S1 connected to the source line 150, a drain electrode D1 connected to the capacitor C and the gate electrode G2 of the second thin-film transistor DrTr, and a semiconductor film (not illustrated). When a predetermined voltage is applied to the gate line 140 and the source line 150 to which the first thin-film transistor SwTr is connected, the voltage applied to the source line 150 is stored in the capacitor C as a data voltage.

The second thin-film transistor DrTr has a gate electrode G2 connected to the drain electrode D1 of the first thin-film transistor SwTr and the capacitor C, a drain electrode D2 connected to the power line 160 and the capacitor C, a source electrode S2 connected to the anode 131 of the organic EL element 130, and a semiconductor film (not illustrated). The second thin-film transistor DrTr supplies the current corresponding to the data voltage stored in the capacitor C, from the power line 160 to the anode 131 of the organic EL element 130 via the source electrode S2. As a result, the drive current flows from the anode 131 to cathode 133 in the organic EL element 130, and the EL layer 132 emits light.

The organic EL display device 100 having the structure described above is an active matrix display device which controls display for each pixel 110 located at a different one of the intersections of the gate lines 140 and source lines 150. The first thin-film transistor SwTr and second thin-film transistor DrTr in each pixel 110 (each of the subpixels 110R, 110G, and 110B) cause the corresponding organic EL element 130 to emit light selectively, as a result of which a desired image is displayed.

[Thin-film transistor Substrate]

Figure 4:
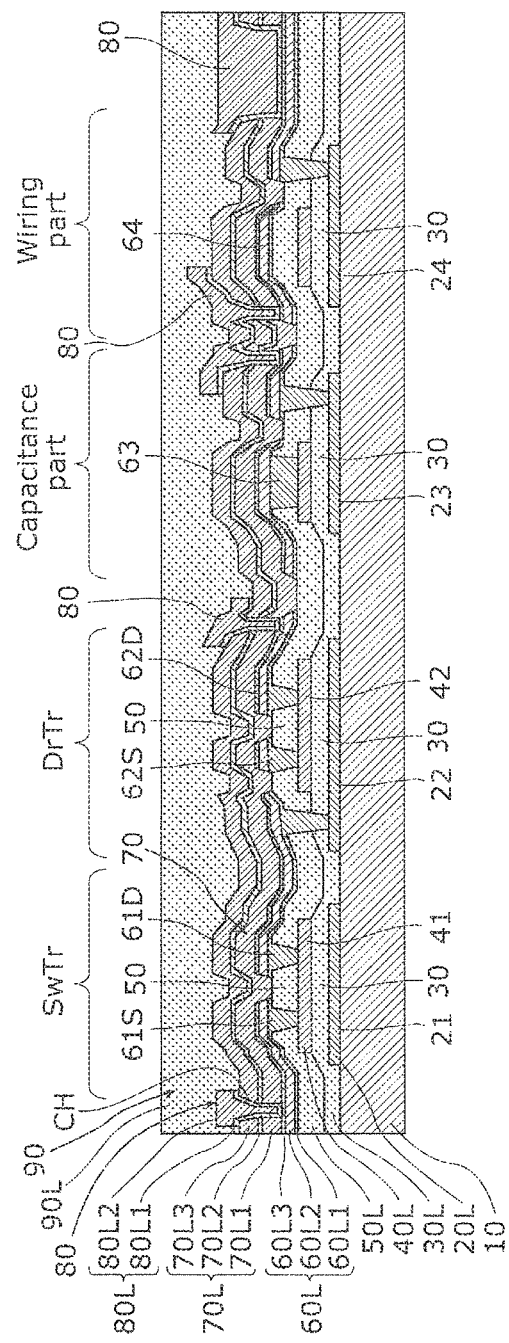
FIG. 4 is a schematic sectional view of a TFT substrate according to the embodiment.

The following describes the TFT substrate 1 according to the embodiment, with reference to FIG. 4. FIG. 4 is a schematic sectional view of the TFT substrate according to the embodiment. The TFT substrate 1 in the aforementioned organic EL display device 100 is described in the following embodiment.

As illustrated in FIG. 4, the first thin-film transistor SwTr, the second thin-film transistor DrTr, a capacitance part (the capacitor C), and a wiring part are formed in the TFT substrate 1.

The TFT substrate 1 includes, on a substrate 10, a first conductive layer 20L, a first insulation layer 30L, a semiconductor layer 40L, a second insulation layer 50L, a second conductive layer 60L, a third insulation layer 70L, a third conductive layer 80L, and a fourth insulation layer 90L. These layers form electrodes, lines, and insulation films in the first thin-film transistor SwTr, the second thin-film transistor DrTr, the capacitance part (the capacitor C), and the wiring crossover part.

The first thin-film transistor SwTr has a gate electrode 21 (the first conductive layer 20L), an insulation film 30 (the first insulation layer 30L) which is a gate insulation film, an oxide semiconductor layer 41 (the semiconductor layer 40L) which is a channel layer, an insulation film 50 (the second insulation layer 50L), and a source electrode 61S and a drain electrode 61D (the second conductive layer 60L). The gate electrode 21, the source electrode 61S, and the drain electrode 61D correspond respectively to the gate electrode G1, the source electrode S1, and the drain electrode D1 in FIG. 3.

The second thin-film transistor DrTr has a gate electrode 22 (the first conductive layer 20L), an insulation film 30 (the first insulation layer 30L) which is a gate insulation film, an oxide semiconductor layer 42 (the semiconductor layer 40L) which is a channel layer, an insulation film 50 (the second insulation layer 50L), and a source electrode 62S and a drain electrode 62D (the second conductive layer 60L). The gate electrode 22, the source electrode 62S, and the drain electrode 62D correspond respectively to the gate electrode G2, the source electrode S2, and the drain electrode D2 in FIG. 3.

The first thin-film transistor SwTr and the second thin-film transistor DrTr according to this embodiment are channel-protection, bottom-gate TFTs, and employ the top contact structure.

The capacitance part has a first electrode 23 (the first conductive layer 20L) and a second electrode 63 (the second conductive layer 60L). The wiring part forms various lines, and has, for example, a first line 24 (the first conductive layer 20L) and a second line 64 (the second conductive layer 60L).

Each structural member in the TFT substrate 1 is described in detail below.

[Substrate]

The substrate 10 is a glass substrate as an example. The substrate 10 is, however, not limited to a glass substrate, and may be a resin substrate or the like. Moreover, the substrate 10 is not limited to a rigid substrate, and may be a sheet-like or film-like flexible substrate such as a flexible glass substrate or a flexible resin substrate. An undercoat layer may be formed on the surface of the substrate 10.

[First Conductive Layer]

The first conductive layer 20L forms the gate electrodes 21 and 22, the first electrode 23, and the first line 24. The gate electrodes 21 and 22, the first electrode 23, and the first line 24 have predetermined shapes on the substrate 10.

The first conductive layer 20L is, for example, a metal such as Ti, Mo, W, Al, or Au or a conductive oxide such as indium tin oxide (ITO). Regarding the metal, an alloy such as MOW may be used. To enhance film adhesion, a stack structure in which a metal such as Ti, Al, or Au as metal having good adhesion to an oxide is sandwiched may be used as the first conductive layer 20L.

[First Insulation Layer]

The insulation film 30 which is the first insulation layer 30L forms the gate insulation film of each of the first thin-film transistor SwTr and second thin-film transistor DrTr. In detail, the insulation film 30 is located between the gate electrode 21 and the oxide semiconductor layer 41 and between the gate electrode 22 and the oxide semiconductor layer 42, and is deposited on the substrate 10 so as to cover the gate electrodes 21 and 22.

The insulation film 30 is, for example, a single-layer film of an oxide thin film such as a silicon oxide film or a hafnium oxide film, a nitride film such as a silicon nitride film, or a silicon oxynitride film, or a stack of these films.

The insulation film 30 is also the interlayer insulation film in the capacitance part and the wiring part, and is formed continuously within the surface of the substrate 10 so as to also cover the first electrode 23 and the first line 24.

[Semiconductor Layer]

The oxide semiconductor layers 41 and 42 which are the semiconductor layer 40L are formed in predetermined shapes above the substrate 10. The oxide semiconductor layer 41 is the channel layer of the first thin-film transistor SwTr, and faces the gate electrode 21. The oxide semiconductor layer 42 is the channel layer of the second thin-film transistor DrTr, and faces the gate electrode 22. For example, the oxide semiconductor layers 41 and 42 are each in the shape of an island on the insulation film 30. In this embodiment, the semiconductor layer is also formed in the capacitance part and the wiring part.

The oxide semiconductor layers 41 and 42 are desirably made of a transparent amorphous oxide semiconductor (TAOS) such as $InGaZnO_x$ (IGZO) containing In—Ga—Zn—O. A thin-film transistor having the transparent amorphous oxide semiconductor as its channel layer has high carrier mobility, and is suitable for large-screen, high-resolution display devices. The transparent amorphous oxide semiconductor is also capable of low-temperature deposition, and so can be formed easily on a flexible substrate.

For example, the amorphous oxide semiconductor of $InGaZnO_x$ can be deposited by vapor deposition such as sputtering or laser deposition using, as a target, a polycrystalline sintered body having a composition of $InGaO_3(ZnO)_4$.

[Second Insulation Layer]

The insulation film 50 which is the second insulation layer SQL is deposited on the insulation film 30 so as to cover the semiconductor layer 40L. Thus, the insulation film 50 covers the oxide semiconductor layers 41 and 42, and functions as a protection film (channel protection film) for protecting the oxide semiconductor layers 41 and 42. The insulation film 50 is a silicon oxide film ($SiO_2$) as an example.

Openings are formed in part of the insulation film 50 (the second insulation layer 50L) through its thickness, and the oxide semiconductor layer 41 is connected to the source electrode 61S and the drain electrode 61D via these openings (contact holes). Likewise, the oxide semiconductor layer 42 is connected to the source electrode 62S and the drain electrode 62D via contact holes formed through the insulation film 50.

[Second Conductive Layer]

The second conductive layer 60L forms the source electrode 61S and the drain electrode 61D, the source electrode 62S and the drain electrode 62D, the second electrode 63, and the second line 64. The second conductive layer 60L also functions as wiring for connecting various signal lines and electrodes.

The source electrode 61S and the drain electrode 61D, the source electrode 62S and the drain electrode 62D, the second electrode 63, the second line 64 have predetermined shapes on the insulation film 50.

The second conductive layer 60L is a three-layer stacked film including: a first conductive film 60L1 which is a copper manganese (CuMn) alloy film or a molybdenum (Mo) film; a second conductive film 60L2 which is a copper (Cu) film formed on the first conductive film 60L1; and a third conductive film 60L3 which is a CuMn alloy film formed on the second conductive film 60L2.

Thus, the source electrodes 61S and 62S and the drain electrodes 61D and 62D may be a stacked film formed by stacking a CuMn alloy film, a Cu film, and a CuMn alloy film in this order from bottom to top, or a stacked film formed by stacking a Mo film, a Cu film, and a CuMn alloy film in this order from bottom to top. The same applies to the second electrode 63 and the second line 64. Here, a CuMn alloy film is an alloy film of copper and manganese.

The first conductive film 60L1 which is the lowermost layer of the second conductive layer 60L functions as an adhesion layer to the underlayer (the semiconductor layer 40L and the second insulation layer 50L), and also functions as a Cu diffusion prevention layer for preventing Cu atoms in the second conductive film 60L2 from diffusing and entering into the semiconductor layer 40L.

The second conductive film 60L2 which is the intermediate layer of the second conductive layer 60L is a main electrode layer containing Cu as a major ingredient, and is located between the first conductive film 60L1 as its lower layer and the third conductive film 60L3 as its upper layer. The use of a Cu film as the second conductive film 60L2 contributes to lower resistance of the second conductive layer 60L (lines and electrodes).

The third conductive film 60L3 which is the uppermost layer of the second conductive layer 60L is a cap layer for protecting the second conductive film 60L2. The use of a CuMn alloy film as the third conductive film 60L3 prevents Cu atoms in the second conductive film 60L2 from oxidizing and causing alteration of the second conductive film 60L2, thus preventing higher resistance of the second conductive layer 60L (source electrodes, drain electrodes, lines, etc.) due to Cu oxidation.

Although the top contact structure in which the insulation film 50 is inserted between the oxide semiconductor layer and each of the source and drain electrodes is employed in this embodiment, the side contact structure in which the source and drain electrodes directly cover the ends of the oxide semiconductor layer may be employed.

[Third Insulation Layer]

An insulation film 70 which is the third insulation layer 70L is formed so as to cover the first thin-film transistor SwTr, the second thin-film transistor DrTr, the capacitance part, and the wiring part. In detail, the insulation film 70 is formed on the second conductive layer 60L, and covers the source electrode 61S and drain electrode 61D in the first thin-film transistor SwTr, the source electrode 62S and drain electrode 62D in the second thin-film transistor DrTr, the second electrode 63 in the capacitance part, and the second line 64 in the wiring part.

The insulation film 70 is a three-layer stacked film including: a first insulation film 70L1 formed on the second conductive layer 60L; a second insulation film 70L2 formed on the first insulation film 70L1; and a third insulation film 70L3 formed on the second insulation film 70L2.

The first insulation film 70L1 which is the lowermost layer of the third insulation layer 70L is a silicon oxide film (first silicon oxide film), and is formed on the uppermost layer (CuMn alloy film) of the second conductive layer 60L. The film thickness of the first insulation film 70L1 is, for example, not less than 100 nm and not greater than 500 nm.

A silicon oxide film generates less hydrogen than a silicon nitride film during deposition. Accordingly, the use of a silicon oxide film as the first insulation film 70L1 prevents damage to the oxide semiconductor layers 41 and 42. If a silicon nitride film is deposited on the oxide semiconductor layers 41 and 42 made of an oxide semiconductor such as TAOS, gas such as hydrogen generated during deposition and having a reduction action may change the composition of the oxide semiconductor layers 41 and 42, making it impossible for the oxide semiconductor layers 41 and 42 to exhibit designed performance. If a silicon oxide film is deposited, on the other hand, hydrogen is not generated, so that the oxide semiconductor layers 41 and 42 can exhibit desired performance.

Moreover, in the case where the underlayer of the insulation film 70 is a CuMn film or a Cu film and an aluminum oxide film is used in part of the insulation film 70, if the first insulation film 70L1 (silicon oxide film) is not formed between the underlayer (CuMn film or Cu film) and the aluminum oxide film, there is a possibility that the underlayer (CuMn film or Cu film) is also etched by a chemical solution (etching solution) used when etching the aluminum oxide film. The first insulation film 70L1 (silicon oxide film) thus functions as an etching stopper layer when etching the aluminum oxide film.

Furthermore, by forming the first insulation film 70L1 (silicon oxide film) under the aluminum oxide film, the aluminum oxide film can be kept away from the semiconductor layer 40L. This prevents the semiconductor layer 40L from being affected by a fixed charge.

The second insulation film 70L2 which is the intermediate layer of the third insulation layer 70L is an aluminum oxide film (alumina film), and is formed on the silicon oxide film which is the first insulation film 70L1. The film thickness of the second insulation film 70L2 is, for example, not less than 10 nm and not greater than 50 nm, and the second insulation film 70L2 is thinner than the first insulation film 70L1 and the third insulation film 70L3.

The oxide semiconductor layers 41 and 42 made of an oxide semiconductor degrade in electrical characteristics when damaged by hydrogen or oxygen. By forming the aluminum oxide film above the oxide semiconductor layers 41 and 42, however, hydrogen or oxygen generated in the upper layer can be blocked by the aluminum oxide film. The use of an aluminum oxide film as the second insulation film 70L2 thus prevents the diffusion of hydrogen or oxygen into the oxide semiconductor layers 41 and 42, as a result of which the oxide semiconductor layers 41 and 42 with stable electrical characteristics are obtained.

The third insulation film 70L3 which is the uppermost layer of the third insulation layer 70L is a silicon oxide film (second silicon oxide film), and is formed on the aluminum oxide film which is the second insulation film 70L2. The film thickness of the third insulation film 70L3 is, for example, not less than 100 nm and not greater than 500 nm.

The insulation film 70 having the structure described above has contact holes CH formed by opening part of the insulation film 70. For example, a contact hole CH is formed in the insulation film 70 to establish contact between the source electrode 61S of the first thin-film transistor SwTr and relay wiring 80. This contact hole CH is formed by removing part of the first insulation film 70L1, second insulation film 70L2, and third insulation film 70L3.

The insulation film 50 (second insulation layer 50L) may have the same structure as the insulation film 70 (third insulation layer 70L).

[Third Conductive Layer]

The third conductive layer 80L forms various relay wiring 80. The relay wiring 80 interconnects the source and drain electrodes of the first thin-film transistor SwTr and second thin-film transistor DrTr and various lines, via the contact holes CH (openings) in the insulation film 70. For example, the relay wiring 80 is connected to the source electrode 61S of the first thin-film transistor SwTr via the contact hole CH in the insulation film 70, as illustrated in FIG. 4.

The relay wiring 80 is composed of lower-layer wiring 80L1 which is a film of a transparent conductive oxide such as ITO, and upper-layer wiring 80L2 which is a Cu film formed on the lower-layer wiring 80L1.

[Fourth Insulation Layer]

An insulation film 90 which is the fourth insulation layer 90L is formed above the whole surface of the substrate 10 so as to cover the relay wiring 80. In detail, the insulation film 90 is formed on the third insulation layer 70L (insulation film 70) so as to cover the relay wiring 80.

The insulation film 90 is a protection film. For example, the insulation film 90 is made of a resin-coated photosensitive insulation material including silsesquioxane, acrylic, and siloxane, which can attenuate light having a wavelength of 450 nm or less. The insulation film 90 may be a stacked film of such a photosensitive insulation material and an inorganic insulation material, or a single-layer film of an inorganic insulation material. Examples of the inorganic insulation material include silicon oxide, aluminum oxide, and titanium oxide. The inorganic insulation material is deposited by chemical vapor deposition (CVD), sputtering, atomic layer deposition (ALD), or the like.

[Method of Manufacturing Thin-film Transistor Substrate]

Figure 5:
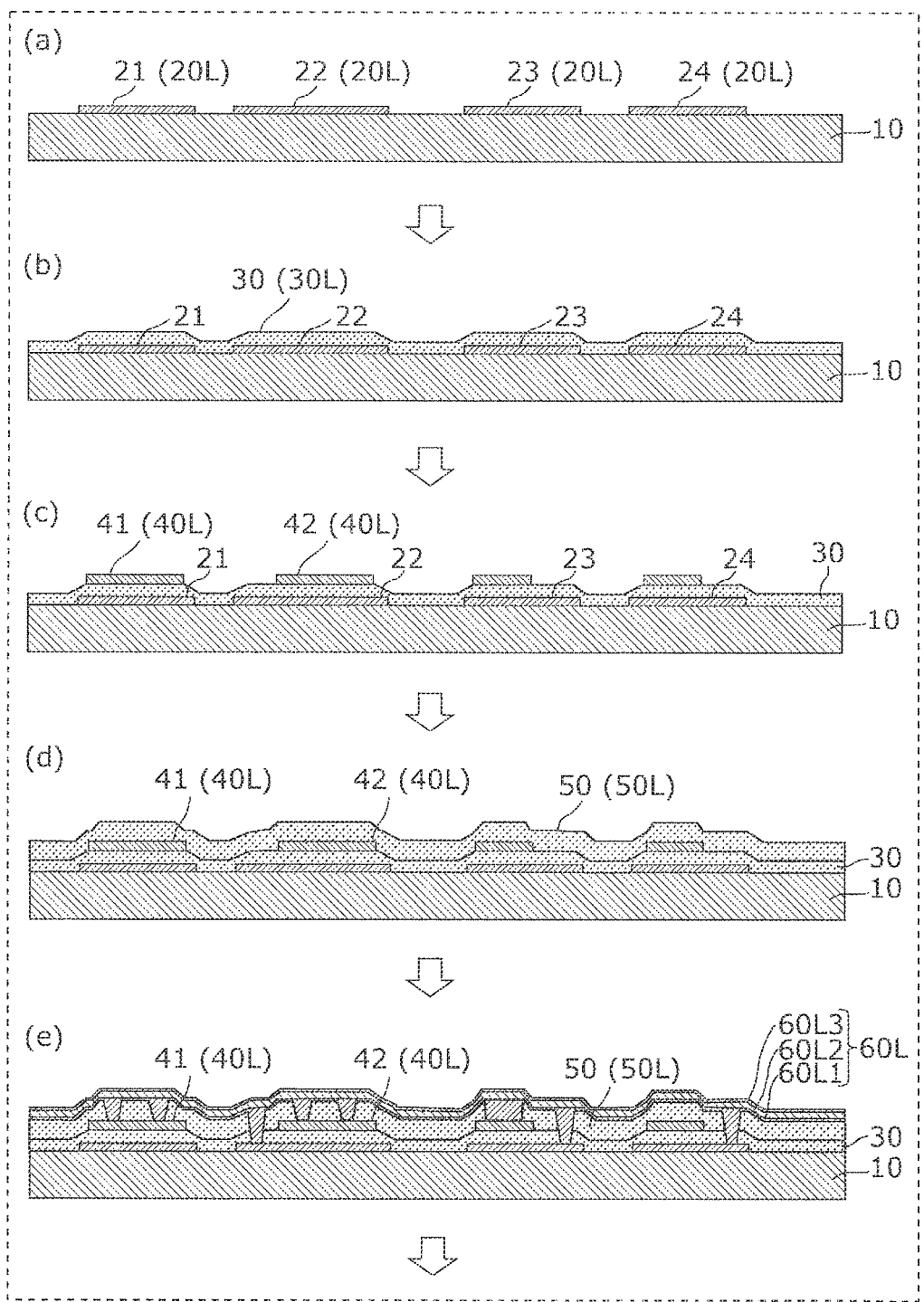
FIG. 5 is a sectional view illustrating steps in a method of manufacturing a TFT substrate according to the embodiment.
Figure 6:
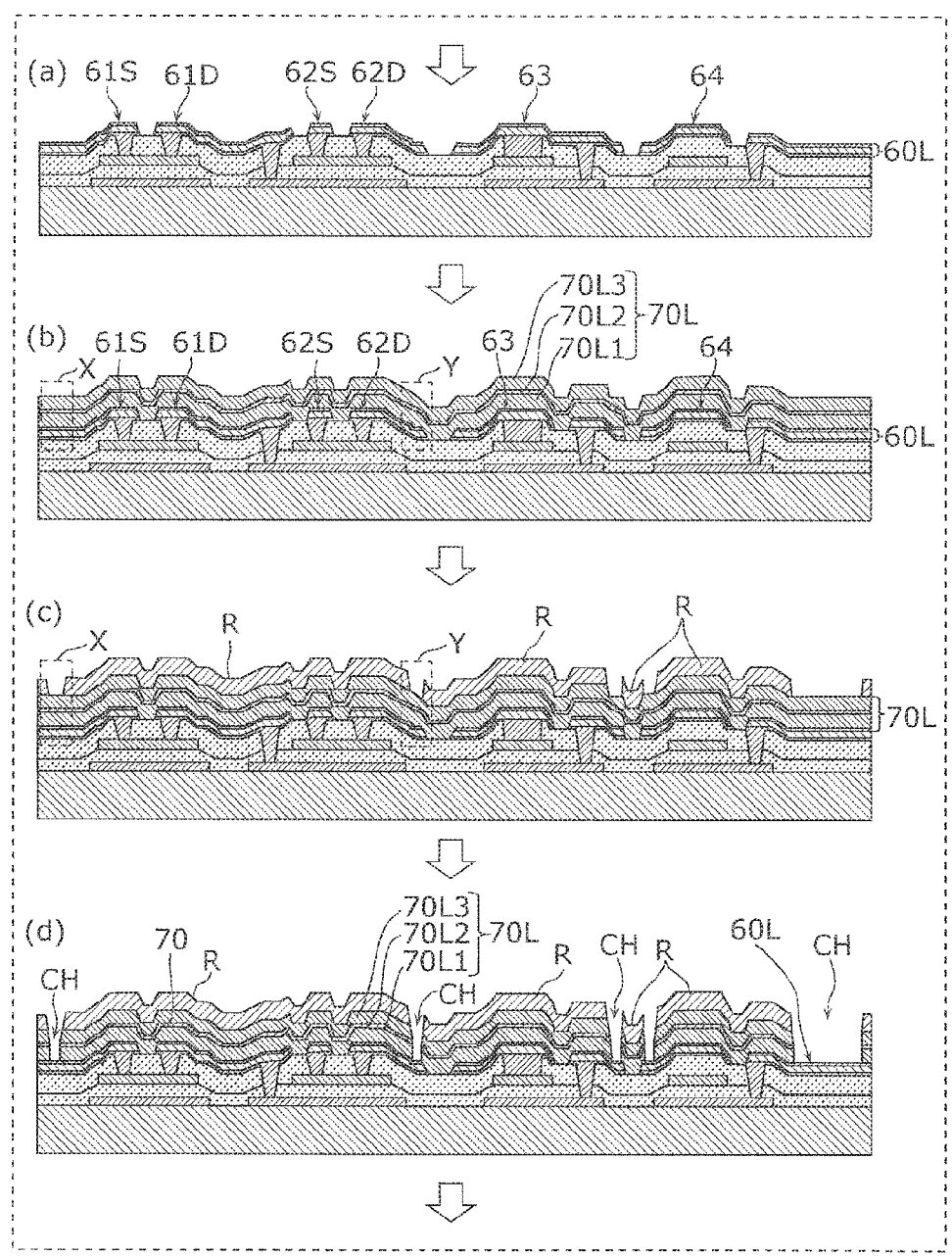
FIG. 6 is a sectional view illustrating steps in the method of manufacturing the TFT substrate according to the embodiment.
Figure 7:
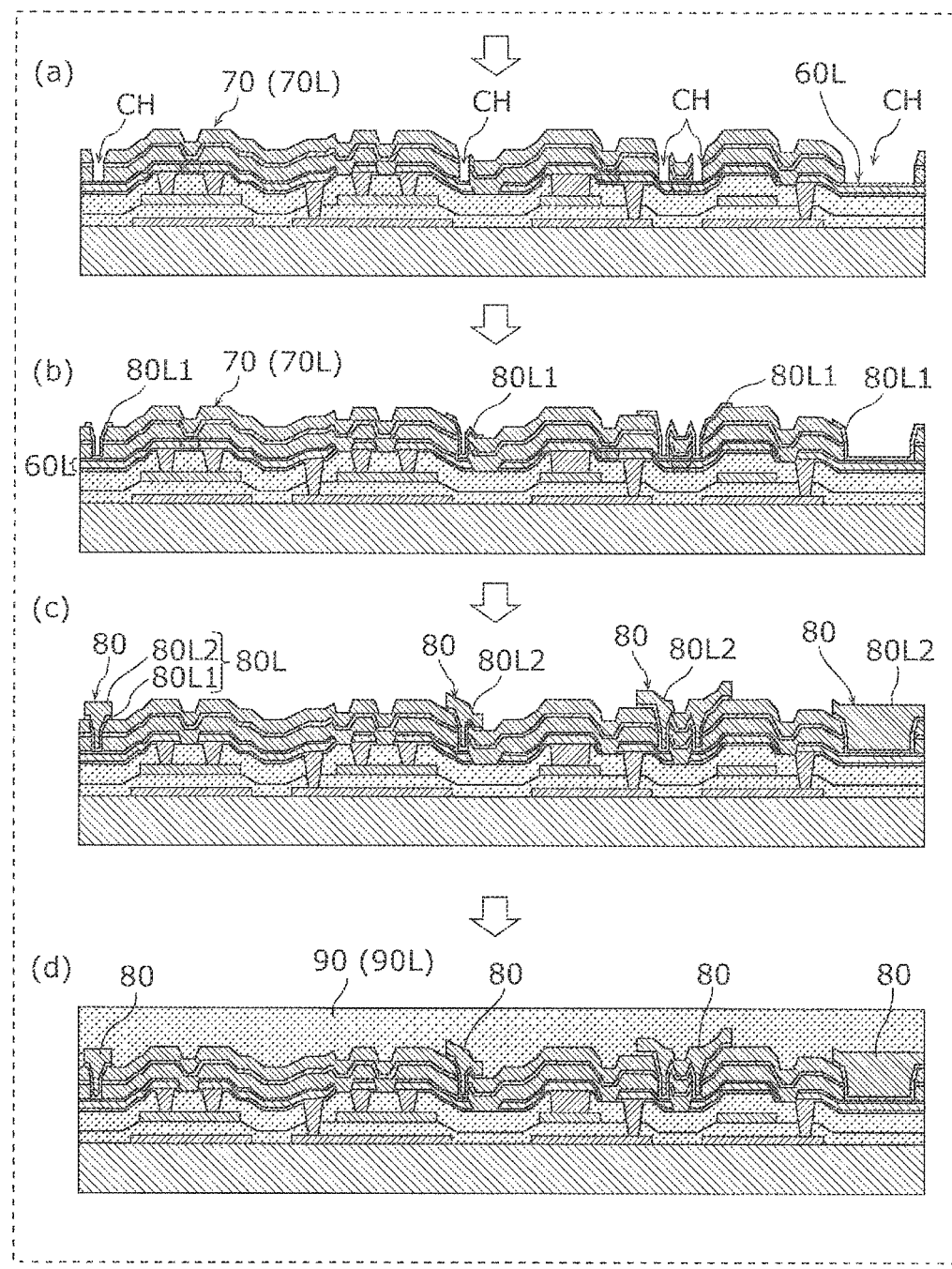
FIG. 7 is a sectional view illustrating steps in the method of manufacturing the TFT substrate according to the embodiment.

The following describes a method of manufacturing the TFT substrate 1 according to the embodiment, with reference to FIGS. 5 to 7. FIGS. 5 to 7 are sectional views illustrating the steps in the method of manufacturing the TFT substrate according to the embodiment.

First, as illustrated in FIG. 5(*a*), the substrate 10 is prepared, and the gate electrode 21, the gate electrode 22, the first electrode 23, and the first line 24 are formed in predetermined shapes above the substrate 10 as the first conductive layer 20L. For example, a metal film is deposited on the substrate 10 by sputtering, and the deposited metal film is processed by photolithography and wet etching to be patterned in predetermined shapes.

Next, as illustrated in FIG. 5(*b*), the insulation film 30 is formed above the substrate 10 as the first insulation layer 30L. For example, the insulation film 30 which is a silicon oxide film is deposited by plasma CVD or the like so as to cover the gate electrode 21, the gate electrode 22, the first electrode 23, and the first line 24.

Next, as illustrated in FIG. 5(*c*), the oxide semiconductor layers 41 and 42 in predetermined shapes are formed above the substrate 10 as the semiconductor layer 40L. For example, a transparent amorphous oxide semiconductor of InGaZnO$_x$ is deposited on the insulation film 30 by sputtering or the like, and the deposited transparent amorphous oxide semiconductor is processed by photolithography and etching, to form the oxide semiconductor layers 41 and 42 in the predetermined shapes on the insulation film 30 respectively above the gate electrodes 21 and 22.

In this embodiment, the respective oxide semiconductor layers are also formed on the insulation film 30 above the first electrode 23 and the first line 24, as the semiconductor layer 40L.

Next, as illustrated in FIG. 5(*d*), the insulation film 50 is deposited on the insulation film 30 so as to cover the semiconductor layer 40L (oxide semiconductor layers) in the predetermined shapes, as the second insulation layer 50L. For example, the insulation film 50 which is a silicon oxide film is deposited by plasma CVD.

After this, part of the insulation film 50 is removed by etching, to form a contact hole for establishing contact between the oxide semiconductor layer 41 and each of the source electrode 61S and the drain electrode 61D and a contact hole for establishing contact between the oxide semiconductor layer 42 and each of the source electrode 62S and the drain electrode 62D. For example, each contact hole is formed through the insulation film 50 by photolithography and etching so that part of the oxide semiconductor layers 41 and 42 is exposed.

In this embodiment, a contact hole is also formed through the insulation film 50 so that part of the oxide semiconductor layer in the capacitance part is exposed, and a contact hole is also formed through the insulation films 30 and 50 so that part of each of the gate electrode 22, the first electrode 23, and the first line 24 is exposed.

Next, as illustrated in FIG. 5(*e*), the second conductive layer 60L is formed on the insulation film 50 so as to fill in the contact holes of the insulation film 50. In this embodiment, the second conductive layer 60L having a three-layer structure is formed.

In detail, a Mo film or a CuMn film is deposited on the insulation film 50 as the first conductive film 60L1, a Cu film is deposited on the first conductive film 60L1 as the second conductive film 60L2, and a CuMn film is deposited on the second conductive film 60L2 as the third conductive film 60L3. In this embodiment, a CuMn alloy film is deposited by sputtering as the first conductive film 60L1, a Cu film is deposited by sputtering as the second conductive film 60L2, and a CuMn alloy film is deposited by sputtering as the third conductive film 60L3.

Next, as illustrated in FIG. 6(*a*), the second conductive layer 60L which is a stacked film of the first conductive film 60L1, second conductive film 60L2, and third conductive film 60L3 is processed to form the source electrode 61S and the drain electrode 61D, the source electrode 62S and the drain electrode 62D, the second electrode 63, and the second line 64 in predetermined patterns. For example, the second conductive layer 60L is processed by photolithography and etching.

Next, as illustrated in FIG. 6(*b*), the third insulation layer 70L is formed so as to cover the source electrode 61S and the drain electrode 61D, the source electrode 62S and the drain electrode 62D, the second electrode 63, and the second line 64.

In detail, the first insulation film 70L1, the second insulation film 70L2, and the third insulation film 70L3 are deposited on the second conductive layer 60L.

Next, as illustrated in FIG. 6(*c*), a resist R in a predetermined shape is formed on the third insulation layer 70L. The resist R has openings to remove part of the third insulation layer 70L. The openings of the resist R are located, for example, above the source electrode 61S and the drain electrode 62D. The resist R may also have openings in the capacitance part and the wiring part according to need, as illustrated in 6(*c*).

Next, as illustrated in FIG. 6(*d*), the resist R is used as a mask to form openings through the third insulation layer 70L which is a stacked film of the first insulation film 70L1, second insulation film 70L2, and third insulation film 70L3, thus exposing part of the second conductive layer 60L.

For example, part of the third insulation layer 70L above the source electrode 61S and the drain electrode 62D is removed by photolithography and etching, to form contact holes CH through the third insulation layer 70L. The third insulation layer 70L may also have contact holes CH in the capacitance part and the wiring part, as illustrated in FIG. 6(*d*).

The steps in FIGS. 6(b) to (d) will be described in detail later.

Next, as illustrated in FIG. 7(a), the resist R on the insulation film 70 (the third insulation layer 70L) is removed to expose the whole surface of the insulation film 70.

Next, as illustrated in FIG. 7(b), the lower-layer wiring 80L1 in a predetermined shape is formed to contact the second conductive layer 60L (the source electrode 61S, the drain electrode 62D, etc.) via the contact holes CH of the insulation film 70 (the third insulation layer 70L).

For example, first a conductive film which is an ITO film is deposited along the surface of each contact hole CH and the surface of the insulation film 70 (the third insulation layer 70L) so as to cover the exposed second conductive layer 60L (the source electrode 61S, the drain electrode 62D, etc.), by sputtering.

The conductive film (ITO film) is then processed by photolithography and wet etching, to form the lower-layer wiring 80L1 in a predetermined pattern at the positions corresponding to the contact holes CH. Thermal annealing may be subsequently performed to decrease the resistance of the lower-layer wiring 80L1.

Next, as illustrated in FIG. 7(c), the upper-layer wiring 80L2 is formed on the lower-layer wiring 80L1. As a result, the relay wiring 80 in a predetermined shape can be formed as the third conductive layer 80L.

For example, first a conductive film which is a Cu film is deposited on the third insulation layer 70L so as to cover the lower-layer wiring 80L1, by sputtering.

The conductive film (Cu film) is then processed by photolithography and wet etching so that the Cu film remains only on the lower-layer wiring 80L1. Thus, the relay wiring 80 which is a stacked film of the lower-layer wiring 80L1 and the upper-layer wiring 80L2 is formed at the predetermined positions.

Next, as illustrated in FIG. 7(d), the insulation film 90 is formed on the third insulation layer 70L so as to cover the relay wiring 80, as the fourth insulation layer 90L.

[Details on Deposition and Etching of Third Insulation Layer 70L]

Figure 8:
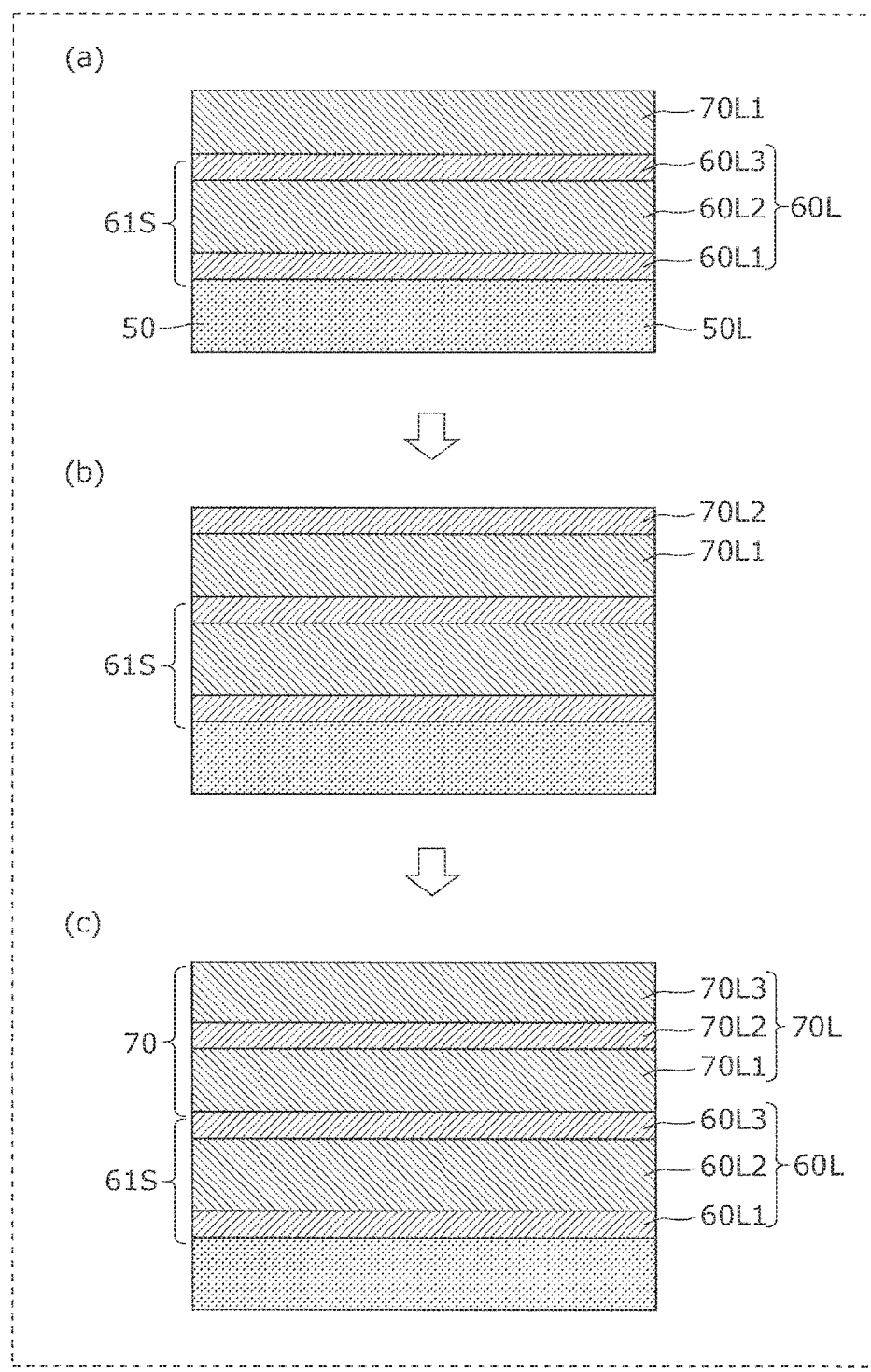
FIG. 8 is a view illustrating a step of depositing a third insulation layer in the TFT substrate according to the embodiment.
Figure 9:
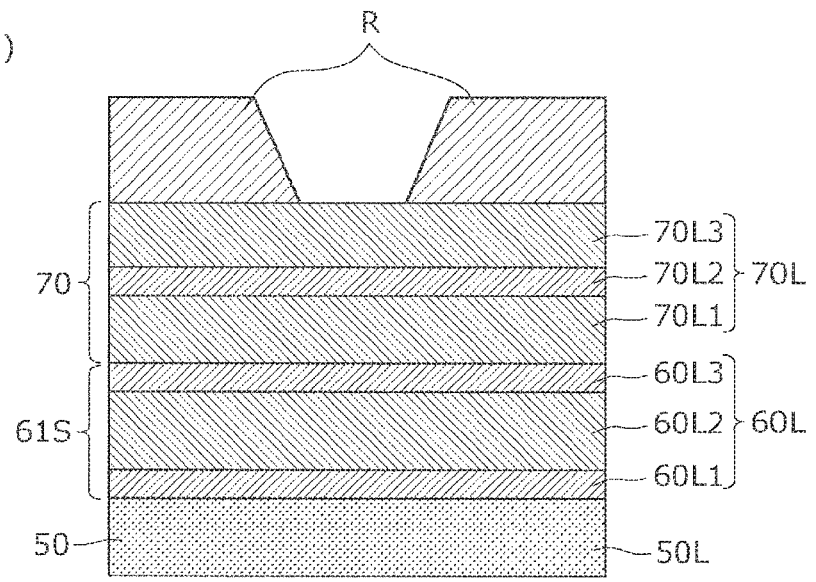
FIG. 9 is a view illustrating a step of processing the third insulation layer in the TFT substrate according to the embodiment.
Figure 9:
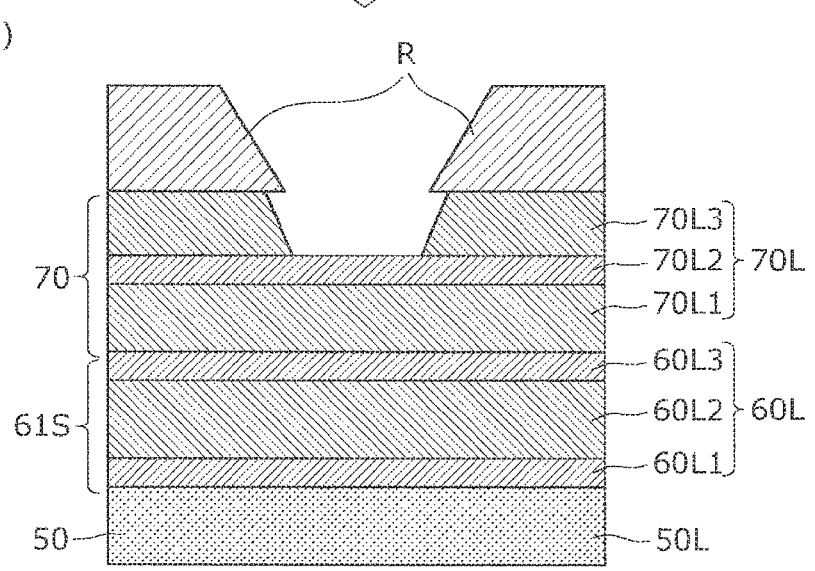
Figure 10:
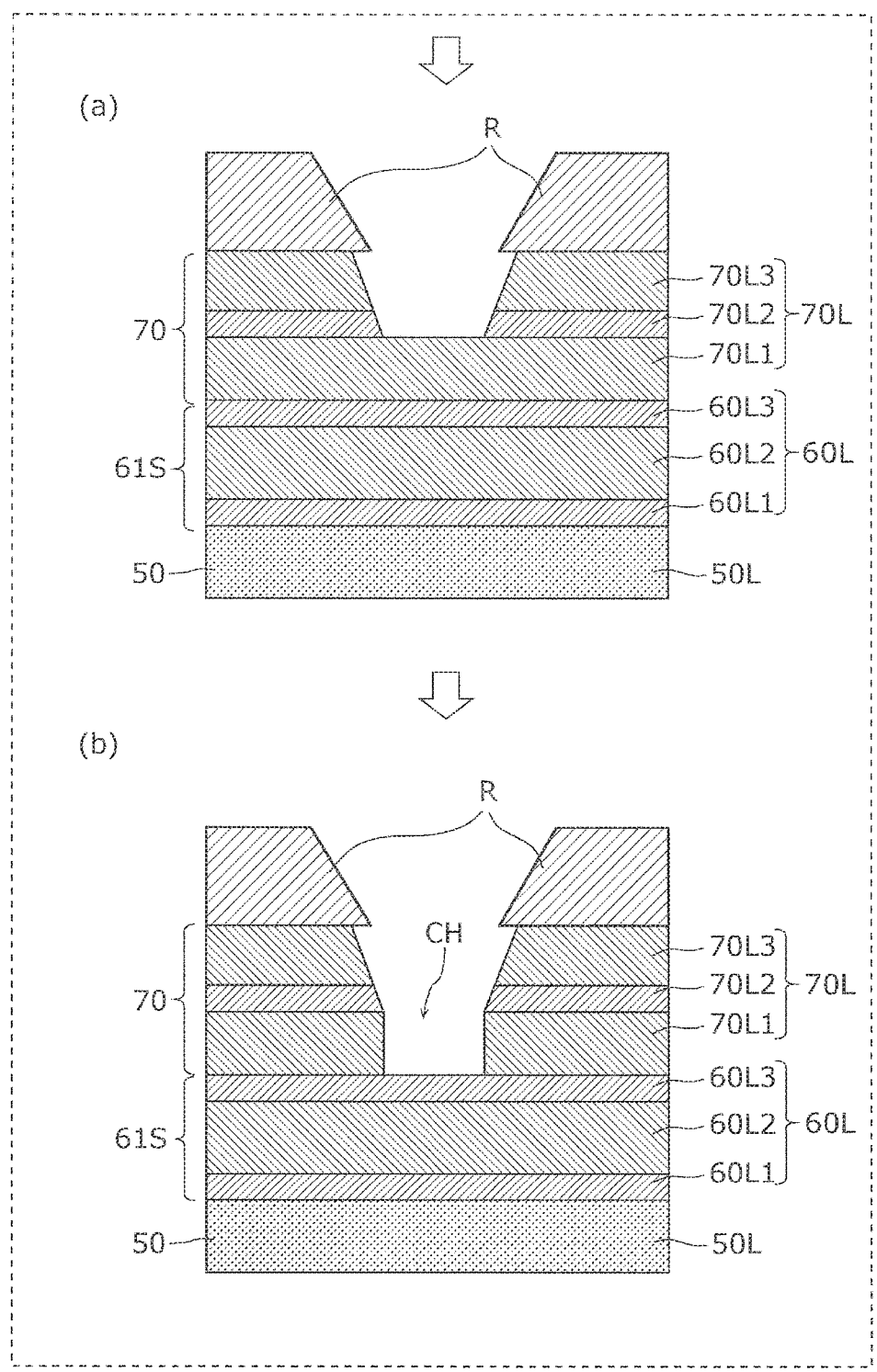
FIG. 10 is a view illustrating the step of processing the third insulation layer in the TFT substrate according to the embodiment.

The deposition and processing of the third insulation layer 70L are described in detail below, with reference to FIGS. 8 to 10. FIG. 8 is a view illustrating the step of depositing the third insulation layer in the TFT substrate according to the embodiment, where area X in the dashed line box in FIG. 6(b) is enlarged. FIGS. 9 and 10 are views illustrating the step of processing the third insulation layer in the TFT substrate according to the embodiment, where area X in the dashed line box in FIG. 6(c) is enlarged.

First, as illustrated in FIG. 8(a), after the formation of the second conductive layer 60L above the substrate 10, the first insulation film 70L1 is deposited on the third conductive film 60L3 (CuMn alloy film) which is the uppermost layer of the second conductive layer 60L (the source electrode 61S in FIG. 8), at a predetermined first temperature.

In this embodiment, a silicon oxide film (first silicon oxide film) is formed on the third conductive film 60L3 (CuMn alloy film) by plasma CVD, as the first insulation film 70L1.

For example, the silicon oxide film is deposited using a parallel plate plasma CVD device, under the deposition condition that the in-chamber pressure is 133 Pa, the RF (high frequency) is 13 kW, the gas flow rate of $SiH_4$ is 1000 sccm, and the gas flow rate of $N_2O$ is 100000 sccm. In this embodiment, the temperature (predetermined first temperature) during the deposition of the first insulation film 70L1 is the temperature of the substrate 10, and is, for example, 230° C. or lower.

Next, as illustrated in FIG. 8(b), the second insulation film 70L2 is formed on the first insulation film 70L1. In this embodiment, an aluminum oxide film is deposited on the first insulation film 70L1 which is a silicon oxide film by sputtering, as the second insulation film 70L2.

For example, the aluminum oxide film is deposited using a reactive sputtering device with aluminum as a target, under the deposition condition that the in-chamber pressure is 0.65 Pa, the applied voltage power is 30 kW, the gas flow rate of Ar is 200 sccm, and the gas flow rate of $O_2$ is 100 sccm (oxygen flow ratio: 42%).

The refractive index of the second insulation film 70L2 (aluminum oxide film) may be about 1.55 to 1.65 for light having a wavelength of 633 nm. While the second insulation film 70L2 is processed by wet etching as described later, processability is favorable when the refractive index of the second insulation film 70L2 is about 1.55 to 1.65.

Next, as illustrated in FIG. 8(c), the third insulation film 70L3 is deposited on the second insulation film 70L2, at a predetermined second temperature higher than the first temperature. In this embodiment, a silicon oxide film (second silicon oxide film) is formed on the second insulation film 70L2 which is an aluminum oxide film by plasma CVD, as the third insulation film 70L3.

For example, the silicon oxide film is deposited using a parallel plate plasma CVD device, under the deposition condition that the in-chamber pressure is 133 Pa, the RF (high frequency) is 13 kW, the gas flow rate of $SiH_4$ is 1000 sccm, and the gas flow rate of $N_2O$ is 100000 sccm. In this embodiment, the temperature (predetermined second temperature) during the deposition of the third insulation film 70L3 is the temperature of the substrate 10, and is, for example, 290° C. or higher.

In this way, the insulation film 70 which is the third insulation layer 70L having a three-layer structure is deposited on the second conductive layer 60L.

Next, as illustrated in FIG. 9(a), the pattern of the resist (resist film) R in a predetermined shape having an opening is formed on the insulation film 70 which is the third insulation layer 70L. In detail, a resist made of a photosensitive resin material is applied onto the insulation film 70 to a predetermined film thickness, and then the resist is exposed through a photomask formed in the pattern, to develop the resist. The pattern of the resist R having an opening is formed in this way.

The opening of the resist R is intended to form a contact hole in the third insulation layer 70L (the insulation film 70). For example, the opening of the resist R corresponds to the contact portion between the source electrode 61S and the relay electrode 80.

Next, as illustrated in FIG. 9(b), the third insulation film 70L3 which is the uppermost layer of the third insulation layer 70L (the insulation film 70) is processed. In detail, the third insulation film 70L3 which is a silicon oxide film is dry etched. The third insulation film 70L3 below the opening of the resist R is selectively removed by dry etching.

For example, dry etching is performed using a reactive ion etching (RIE) device. The etching gas is, for example, sulfur hexafluoride ($SF_5$) and $O_2$. An example of the etching condition is that the gas flow rate of $SF_5$ is 2000 sccm, the gas flow rate of $O_2$ is 2000 sccm, the pressure is 13 Pa, and the applied power is 10000 W. The etching gas may be carbon tetrafluoride ($CF_4$) and $O_2$.

Due to this etching gas, the open ends of the resist R recede so that the opening is wider than before etching. Besides, the opening (opening size) of the third insulation film 70L3 becomes wider than the opening (opening size) of the resist R, because of the difference in etching rate between the resist R and the third insulation film 70L3.

Next, as illustrated in FIG. 10(a), the second insulation film 70L2 which is the intermediate layer of the third insulation layer 70L (the insulation film 70) is processed. In detail, the second insulation film 70L2 which is an aluminum oxide film is wet etched. The second insulation film 70L2 below the opening of the third insulation film 70L3 is selectively removed by wet etching.

The etching solution is, for example, an alkaline solution such as a potassium hydroxide (KOH) solution. For example, the aluminum oxide film may be etched using a KOH solution with a KOH concentration in the range of 1 wt % to 40 wt %.

Next, as illustrated in FIG. 10(b), the first insulation film 70L1 which is the lowermost layer of the third insulation layer 70L (the insulation film 70) is processed. In detail, the first insulation film 70L1 which is a silicon oxide film is dry etched. The first insulation film 70L1 below the opening of the second insulation film 70L2 is selectively removed by dry etching.

For example, dry etching is performed using a RIE device. The etching gas is, for example, carbon tetrafluoride ($CF_4$) and $O_2$. An example of the etching condition is that the gas flow rate of $CF_4$ is 4000 sccm, the gas flow rate of $O_2$ is 1000 sccm, the pressure is 13 Pa, and the applied power is 12000 W. Since a silicon oxide film has high selectivity (etching rate) in being cut away by dry etching with respect to an alumina oxide film, the cross-sectional (inner peripheral) shape in the open ends of the first insulation film 70L1 which is a silicon oxide film can be close to a vertical plane, as illustrated in FIG. 10(b).

The resist R is then removed, though not illustrated. In detail, the resist R is removed by ashing with a $O_2$ radical or a chemical solution. With the resist R removed, an opening (contact hole) is formed through the third insulation layer 70L (the insulation film 70).

Although the third insulation layer 70L above the source electrode 61S which is the second conductive layer 60L is described in this embodiment as indicated by area X in FIGS. 6(b) and (c), the same applies to area Y in FIGS. 6(b) and (c). In other words, a contact hole can be formed in the third insulation layer 70L above the drain electrode 62D by the same method.

[Functions and Effects]

The advantageous effects of the method of manufacturing the TFT substrate according to this embodiment are described below, including how the disclosed technology has been acquired.

TFT electrodes (gate electrodes, source electrodes, drain electrodes), lines (gate lines, source lines, power lines), etc. are formed in a TFT substrate. These electrodes and lines are formed in any of a plurality of conductive layers stacked on a substrate.

Moreover, an insulation layer is formed between the conductive layers, as an interlayer insulation film. An insulation film, e.g. an oxide film such as a silicon oxide film or a nitride film such as a silicon nitride film, is used as the insulation layer, and the insulation layer is a single-layer film composed of a single insulation film or a stacked film of a plurality of insulation films.

Electrodes, lines, etc. in the upper and lower conductive layers are electrically connected via openings (contact holes) provided in the insulation layer.

There has been demand for larger-screen, higher-resolution display devices in recent years, and the use of an oxide semiconductor such as IGZO with high carrier mobility as the channel layer (semiconductor layer) of TFTs has been studied.

In a TFT substrate having TFTs (oxide semiconductor TFTs) whose channel layers are an oxide semiconductor, not a nitride film but an oxide film is used as an insulation film. This is because hydrogen which damages the oxide semiconductor is used when depositing the nitride film. Besides, the use of an aluminum oxide film (alumina film) as an insulation film in a TFT substrate having oxide semiconductor TFTs has been proposed to prevent the diffusion of hydrogen or oxygen into the oxide semiconductor. Study has therefore been conducted to use, as an insulation layer in a TFT substrate having oxide semiconductor TFTs, a three-layer stacked film in which an aluminum oxide film is sandwiched between two upper and lower silicon oxide films.

Increases in screen size and resolution of display devices have fostered the tendency toward longer and thinner wiring. This causes a problem of higher wiring resistance and degraded display image quality. Especially in TFT substrates, an electrode and line of a TFT may be formed in the same layer, and so the material and structure of TFT electrodes are required to achieve not only performance as TFTs but also performance as wiring. Hence, the use of Cu as the TFT electrode material has been studied to realize low-resistance wiring.

In this case, if an oxide film such as a silicon oxide film is formed, as an insulation layer, on an electrode or line containing Cu, a problem in that Cu in the electrode or line is oxidized by oxygen used in the deposition of the oxide film arises. There is also a problem in that desired transistor characteristics cannot be obtained when Cu diffuses into the TFT.

To prevent the oxidation and diffusion of Cu, a CuMn alloy film may be formed on the Cu film as a cap layer.

However, when the aforementioned insulation layer having the three-layer structure is deposited on a CuMn alloy film and an opening is formed through the insulation layer, film floating occurs in the part of the insulation layer where the opening is formed.

Figures 11, 12:
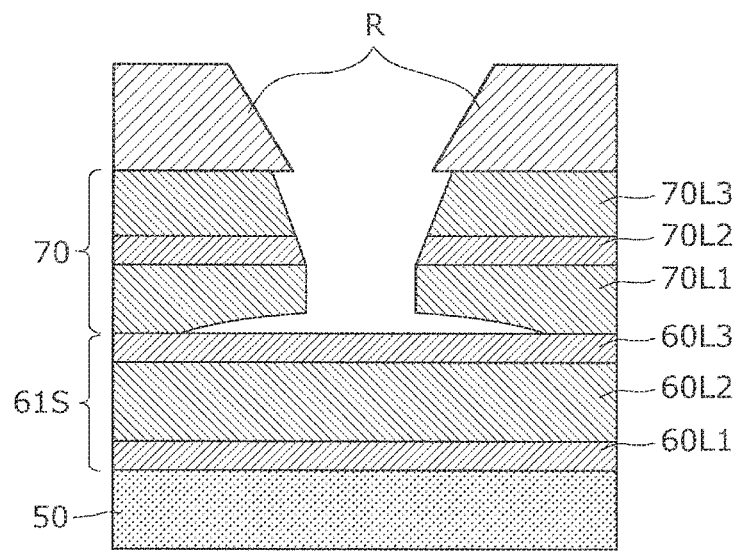
FIG. 11 is a view illustrating a step of processing the third insulation layer in the TFT substrate according to a comparative example.
FIG. 12 is a diagram illustrating the relationship between the deposition temperatures of a first insulation film (lower-layer SiO) and third insulation film (upper-layer SiO) and the number of film floating defects of the insulation film.

For example, as illustrated in FIG. 11, the insulation film 70 having the three-layer structure was formed on a CuMn alloy film by: depositing a silicon oxide film (lower-layer SiO) as the first insulation film 70L1 on the third conductive film 60L3 (CuMn alloy film) which is the cap layer of the source electrode 61S, at 245° C.; depositing an aluminum oxide film as the second insulation film 70L2 on the first insulation film 70L1; and further depositing a silicon oxide film (upper-layer SiO) as the third insulation film 70L3 on the second insulation film 70L2 at 230° C.

After this, to form an opening (contact hole) through the insulation film 70, the third insulation film 70L3 (upper-layer SiO) was dry etched, the second insulation film 70L2 (aluminum oxide) was wet etched, and then the first insulation film 70L1 (lower-layer SiO) was dry etched, as in the foregoing embodiment.

As a result, a gap formed at the interface between the first insulation film 70L1 (lower-layer SiO) and the third conductive film 60L3 (CuMn alloy film) in the etched part, causing film floating of the insulation film 70.

As a result of investigating the cause of such film floating of the insulation film, the inventors of the present application found out that the insulation film 70 suffers film floating depending on the deposition temperatures of the first insulation film 70L1 (lower-layer SiO) and third insulation film 70L3 (upper-layer SiO).

FIG. 12 is a diagram of the experimental results, and illustrates the relationship between the deposition temperatures of the first insulation film 70L1 (lower-layer SiO) and third insulation film 70L3 (upper-layer SiO) and the number of film floating defects of the insulation film 70. The number of film floating defects is the number of occurrences of film floating of the insulation film 70 on the substrate 10. In this experiment, the set temperature of the substrate 10 (substrate temperature) was used as the deposition temperature.

As illustrated in FIG. 12, in the case where the deposition temperature of the first insulation film 70L1 (lower-layer SiO) is higher than or equal to the deposition temperature of the third insulation film 70L3 (upper-layer SiO), the number of film floating defects is 2000 or more.

In the case where the deposition temperature of the first insulation film 70L1 (lower-layer SiO) is lower than the deposition temperature of the third insulation film 70L3 (upper-layer SiO), on the other hand, the number of film floating defects is 400 or less. Thus, the number of film floating defects can be reduced to 400 or less by depositing the third insulation film 70L3 (upper-layer SiO) at a deposition temperature higher than that of the first insulation film 70L1 (lower-layer SiO).

By limiting the deposition temperature of the first insulation film 70L1 (lower-layer SiO) to 230° C. or lower, the number of film floating defects can be reduced to 200 or less.

Further, by limiting the deposition temperature of the third insulation film 70L3 (upper-layer SiO) to 290° C. or lower, the number of film floating defects can be reduced to 10 or less.

As described above, the method of manufacturing the TFT substrate according to this embodiment includes: forming a CuMn alloy film above the substrate 10; forming a first silicon oxide film on the CuMn alloy film at a first temperature; forming an aluminum oxide film on the first silicon oxide film; and forming a second silicon oxide film on the aluminum oxide film at a second temperature higher than the first temperature.

In the case of depositing a plurality of silicon oxide films, typically the thermal process temperature of an upper layer is lower than the thermal process temperature of a lower layer. In this embodiment, however, the deposition temperature of the upper-layer silicon oxide film (second silicon oxide film) is higher than the deposition temperature of the lower-layer silicon oxide film (first silicon oxide film).

This prevents the formation of a gap at the interface between the CuMn alloy film and the first silicon oxide film when forming an opening (contact hole) through the insulation film which is a stacked film of the first silicon oxide film, the aluminum oxide film, and the second silicon oxide film. Since the insulation film is kept from film floating, a TFT substrate with desired performance can be realized.

In the case of depositing a silicon oxide film by plasma CVD, typically the deposition temperature is 300° C. or higher, and is not 230° C. or lower in most cases. In this embodiment, however, the deposition temperature of the lower-layer silicon oxide film (first silicon oxide film) is 230° C. or lower.

This further prevents the formation of a gap at the interface between the CuMn alloy film and the first silicon oxide film, and suppresses film floating of the insulation film.

The deposition temperature of the upper-layer silicon oxide film (second silicon oxide film) may be 290° C. or higher, as mentioned above. This further suppresses film floating of the insulation film.

[Modifications]

While the method of manufacturing the TFT substrate has been described above by way of the embodiment, the present disclosure is not limited to the foregoing embodiment.

Although the foregoing embodiment describes the case where the CuMn alloy film which is the underlayer of the insulation film 70 is the source electrode or drain electrode of the thin-film transistor, this is not a limitation, and the CuMn alloy film which is the underlayer of the insulation film 70 may be a part of wiring. The same advantageous effects can be achieved in the case of, when the upper layer of wiring is a CuMn alloy film, depositing the insulation film 70 of the three-layer structure on the CuMn alloy film and forming a contact hole.

Although the foregoing embodiment describes the case where the thin-film transistor is a bottom-gate TFT, the thin-film transistor may be a top-gate TFT.

Although the foregoing embodiment describes the case where the thin-film transistor is a channel-etching-stopper (channel-protection) TFT, the thin-film transistor may be a channel-etching TFT. In other words, the insulating film 50 in the foregoing embodiment may be omitted.

Although the foregoing embodiment describes an organic EL display device as the display device including the TFT substrate, the TFT substrate according to the embodiment is applicable to any other display device including an active matrix substrate, such as a liquid crystal display device.

The display device (display panel) such as an organic EL display device described above may be used as a flat panel display, and is applicable to all kinds of electronics having display panels, such as television sets, personal computers, and mobile phones. The disclosed technology is particularly suitable for large-screen, high-resolution display devices.

Other modifications obtained by applying various changes conceivable by a person skilled in the art to the embodiments and modifications and any combinations of the structural elements and functions in the embodiments and modifications without departing from the scope of the present disclosure are also included in the present disclosure.

INDUSTRIAL APPLICABILITY

The technology disclosed herein is widely usable, for example, in thin-film transistor substrates and display devices such as organic EL display devices including thin-film transistor substrates.

REFERENCE SIGNS LIST

1 TFT substrate
10 substrate
20L first conductive layer
21, 22, G1, G2 gate electrode
23 first electrode
24 first line
30L first insulation layer
30, 50, 70, 90 insulation film
40L semiconductor layer 41, 42 oxide semiconductor layer
50L second insulation layer
60L second conductive layer
60L1 first conductive film
60L2 second conductive film
60L3 third conductive film
61S, 62S, S1, S2 source electrode
61D, 62D, D1, D2 drain electrode
63 second electrode
64 second line
70L third insulation layer
70L1 first insulation film
70L2 second insulation film
70L3 third insulation film
80L third conductive layer
80L1 lower-layer wiring
80L2 upper-layer wiring
100 organic EL display device
110 pixel
110R, 110G, 110B subpixel
111 bank
120 pixel circuit
130 organic EL element
131 anode
132 EL layer
133 cathode
140 gate line
150 source line
160 power line
SwTr first thin-film transistor
DrTr second thin-film transistor
C capacitor
CH contact hole
R resist

The invention claimed is:

1. A method of manufacturing a thin-film transistor substrate that includes a thin-film transistor having a semiconductor layer, the method of manufacturing the thin-film transistor substrate comprising:
    forming a CuMn alloy film above a substrate;
    forming a first silicon oxide film on the CuMn alloy film at a first temperature;
    forming an aluminum oxide film on the first silicon oxide film; and
    forming a second silicon oxide film on the aluminum oxide film at a second temperature higher than the first temperature.

2. The method of manufacturing the thin-film transistor substrate according to claim 1,
    wherein the first temperature is 230° C. or lower.

3. The method of manufacturing the thin-film transistor substrate according to claim 2,
    wherein the second temperature is 290° C. or higher.

4. The method of manufacturing the thin-film transistor substrate according to claim 1, further comprising
    forming an opening through a stacked film composed of the first silicon oxide film, the aluminum oxide film, and the second silicon oxide film,
    wherein the forming of the opening includes processing the aluminum oxide film by wet etching.

5. The method of manufacturing the thin-film transistor substrate according to claim 4,
    wherein the forming of the opening further includes:
    processing the second silicon oxide film by dry etching, before the processing of the aluminum oxide film; and
    processing the first silicon oxide film by dry etching, after the processing of the aluminum oxide film.

6. The method of manufacturing the thin-film transistor substrate according to claim 1, further comprising:
    forming a gate electrode above the substrate;
    forming a gate insulation film on the gate electrode;
    forming the semiconductor layer on the gate insulation film; and
    forming a source electrode and a drain electrode to connect to the semiconductor layer,
    wherein the forming of the source electrode and the drain electrode includes the forming of the CuMn alloy film.

7. The method of manufacturing the thin-film transistor substrate according to claim 6,
    wherein the forming of the source electrode and the drain electrode further includes:
    forming a Mo film;
    forming a Cu film on the Mo film; and
    the forming of the CuMn alloy film on the Cu film.

8. The method of manufacturing the thin-film transistor substrate according to claim 6,
    wherein the forming of the source electrode and the drain electrode further includes:
    forming a first CuMn alloy film;
    forming a Cu film on the first CuMn alloy film; and
    the forming of the CuMn alloy film on the Cu film as a second CuMn alloy film.

9. The method of manufacturing the thin-film transistor substrate according to claim 1,
    wherein the first silicon oxide film and the second silicon oxide film are deposited by plasma CVD.

10. The method of manufacturing the thin-film transistor substrate according to claim 1,
    wherein the semiconductor layer is an oxide semiconductor layer.

11. The method of manufacturing the thin-film transistor substrate according to claim 10,
    wherein the oxide semiconductor layer is a transparent amorphous oxide semiconductor.

12. The method of manufacturing the thin-film transistor substrate according to claim 1,
    wherein the CuMn alloy film is a part of wiring.

* * * * *